United States Patent [19]

Estes, Jr.

[11] Patent Number: 4,922,379

[45] Date of Patent: May 1, 1990

[54] POWER SEMICONDUCTOR PACKAGE

[75] Inventor: Earl M. Estes, Jr., Tucson, Ariz.

[73] Assignee: Hughes Aircraft Company, Los Angeles, Calif.

[21] Appl. No.: 381,559

[22] Filed: Jul. 18, 1989

[51] Int. Cl.⁵ .................. H01L 23/36; H05K 7/20
[52] U.S. Cl. ............................................. 361/388
[58] Field of Search ............ 361/381, 383, 386, 388, 361/389, 395, 399; 174/16.3; 165/80.3, 80.2, 185

[56] References Cited

U.S. PATENT DOCUMENTS 4,577,402 3/1986 Swanstrom .................. 361/386
4,669,028 5/1987 Faa, Jr. ....................... 361/388
4,803,590 2/1989 Fassel et al. ................. 361/388
4,833,569 5/1989 Probst ......................... 361/386

Primary Examiner—Roy N. Envall, Jr.
Attorney, Agent, or Firm—Michael W. Sales; Wanda K. Denson-Low

[57] ABSTRACT

A hermetically sealed power semiconductor package includes a body 11 and a thick metal back 24. The metal back serves as a mounting device as well as a thermal channel for the package eliminating the need for intermediate heatsinks. For example, fasteners 47 extending into the back 24 can be used to mount the package to a printed wiring board 38 and directly to a heatsink 44.

10 Claims, 2 Drawing Sheets

POWER SEMICONDUCTOR PACKAGE

BACKGROUND OF THE INVENTION

1. Technical Field

This invention relates to semiconductor devices and, more particularly, to power semiconductor device packaging.

2. Discussion

Prior art power semiconductor packages include the standard TO-228 and TO-254 semiconductor packages. Both of these packages are similarly hermetically sealed. However, when these packages are mounted perpendicular to the main heatsink, they require a daughter or intermediate heatsink to thermally connect the chip to a main heatsink. The daughter heatsink contributes to poor heat transfer because it consists of another metal to metal thermal contact between the semiconductor chip and the main heatsink. The need for a daughter heatsink also increases the spacing required for installing these power semiconductor devices. Finally, replacement of present semiconductor packages is inconvenienced since the daughter heatsink must also be removed.

SUMMARY OF THE INVENTION

In accordance with the teachings of this invention, a power semiconductor device package is provided which includes a main body having two opposite major surfaces and two opposite end surfaces. The body encapsulates power semiconductor chips in its interior. In addition there is a plurality of pins projecting from one of the end surfaces which are connected to the semiconductor chip. One of the major surfaces is mounted to a relatively thick metal back. This back consists of two opposite major surfaces as well as two broad, opposite end surfaces. Both the end surfaces of the back contain a plurality of holes to accommodate fastening devices.

A mounting arrangement for this package includes a printed wiring board with a plurality of openings therein for receiving pins of the semiconductor package as well as mounting screws for the package. The pins of the package are installed through the openings in the printed wiring board and soldered in place in order to create electrical contact. One end surface of the back is fastened to the printed wiring board through the appropriate mounting openings in the board and holes in the back of the package. The other end surface of the package body is fastened to a heatsink also having a plurality of mounting openings.

This invention provides hermetically sealed power semiconductor packages which minimize spacing while maximizing thermal efficiency. The invention eliminates the need for a daughter heatsink which was previously required in similar semiconductor packages, thus simplifying replacement and providing an efficient means of channeling excess heat generated by most power semiconductor chips.

BRIEF DESCRIPTION OF THE DRAWINGS

The various advantages of the present invention will become apparent to those skilled in the art after reading the following specification and by reference to the drawings in which.

DETAILED DESCRIPTION OF THE PREFERRED EMBODIMENT

Figure 1:
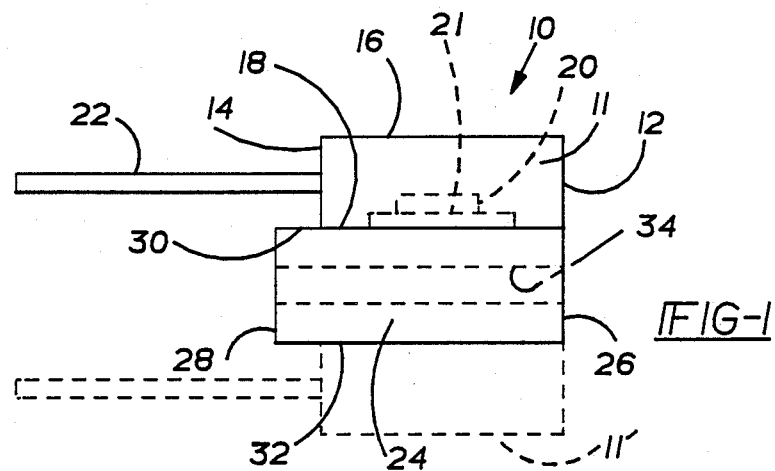
FIG. 1 is a side view of a semiconductor package made in accordance with the teachings of the present invention.
Figure 2:
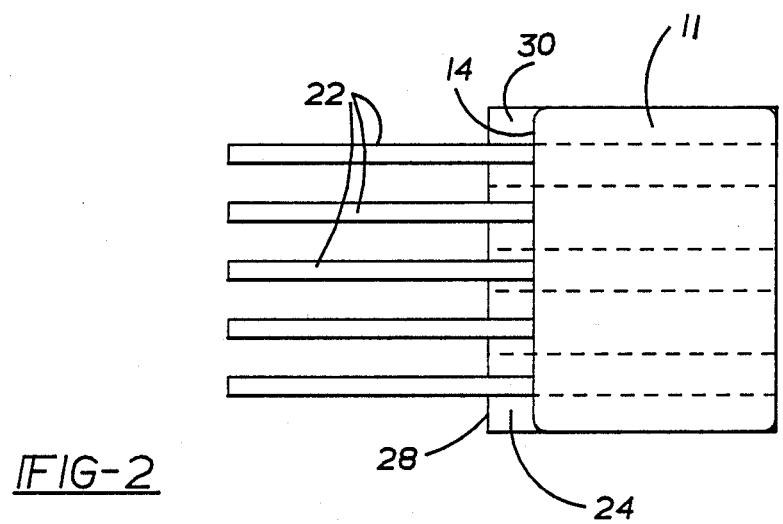
FIG. 2 is a front view of the package shown in FIG. 1.

Referring now to FIGS. 1 and 2, the semiconductor device package 10 includes a semiconductor chip 20 which is mounted on a substrate 21 which, in turn, is surrounded by an encapsulating body 11 made of copper, Kovar, molybdenum, beryllia or alumina. The body 11 has two opposite major surfaces 16 and 18 and two end surfaces 12 and 14. A number of pins 22 connected to the semiconductor chip 20 (e.g. by conventional wire bonds) extend out from the encapsulating body. The encapsulating body may contain multiple semiconductor devices if desired. The substrate 21 is bonded in such a manner to create good thermal contact with a relatively thick metal back 24. The back 24 is generally thicker than body 11, as well as being longer along the axis of the pins 22. By way of a typical example, the back 24 is 0.25 inch thick×0.70 inch wide×0.635 long and can be made of a variety of thermally conductive materials such as aluminum, copper and the like. The back 24 also has two opposite major surfaces 30 and 32 as well as two end surfaces 26 and 28. These end surfaces are large enough so that several tapped holes 34 may be drilled from end surface 26 to end surface 30. These holes 34 accommodate various fasteners, such as mounting screws which are used to attach the device 10 to various printed wiring boards and also to external heatsinks as will be discussed later herein. A second device 11' may be added as seen in FIG. 1 to create a "piggy back" arrangement. The second device is mounted on the other opposite major surface 32 of the back 24.

Figure 3:
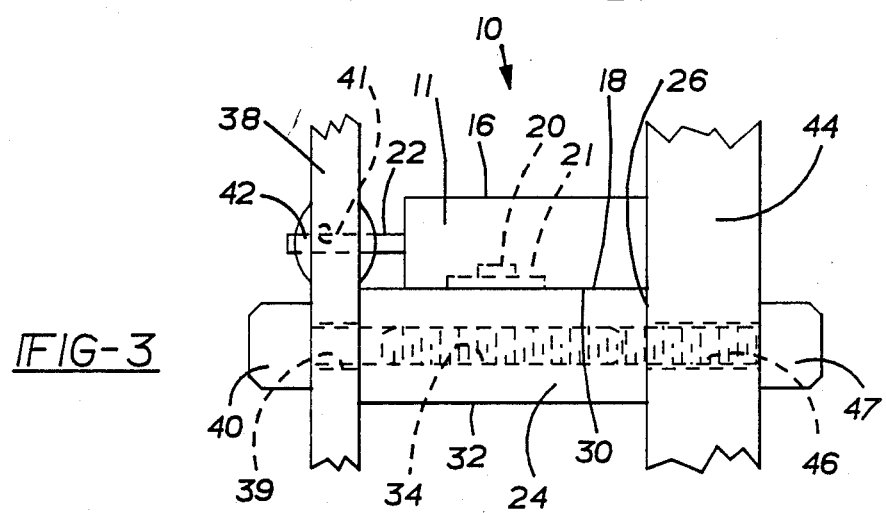
FIG. 3 is a cross-sectional view of a typical mounting arrangement for the package in FIG. 1.
Figure 4:
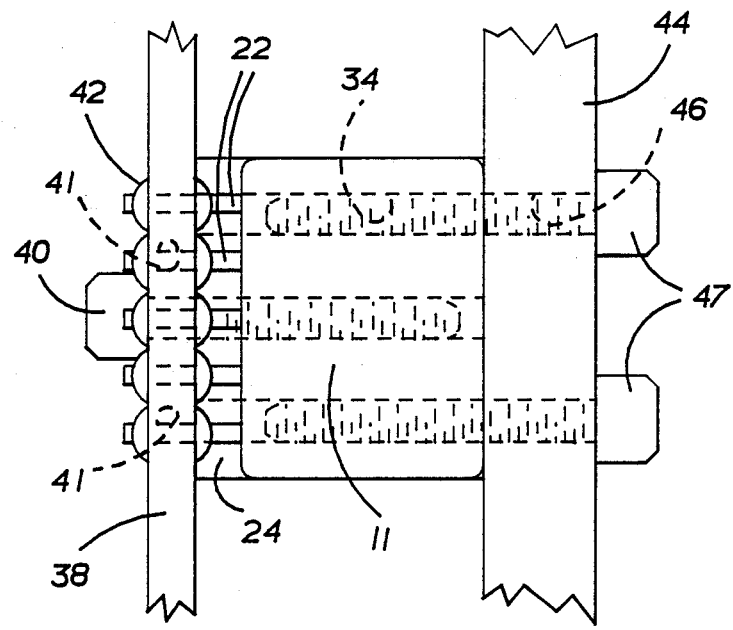
FIG. 4 shows a front view of the mounting arrangement shown in FIG. 3.

A preferred mounting arrangement for device 10 is shown in FIGS. 3 and 4. A printed wiring board 38 has holes 39 drilled therein for fasteners 40 as well as pin receiving openings 41. The pins 22 of device 10 are inserted through the holes 41 and are soldered into place through the use of solder joints 42. The metal back 24 is attached to the printed wiring board 38 through the use of one or more fasteners 40 which engage the threads in openings 34 to draw the underside of the board 38 against end surface 28 of the back 24. The other end surface 26 of the back 24 is similarly attached directly to an external metal heatsink 44. The heatsink 44 has several holes 46 drilled into it in order to accommodate a pair of fasteners 47.

In view of the foregoing, several advantages may be appreciated over the prior art. This invention provides a printed wiring board to heatsink mounting structure without the requirement of a daughter heatsink. This minimizes spacing in addition to eliminating the daughter heatsink for this type of application. This arrangement provides a very secure mounting thereby minimizing the detrimental effects of thermal stresses on the solder joints and hermetic, lead, ceramic or glass seals which may be used. In addition, it provides a secure mounting of the heatsink to the package. This also provides a direct metal to metal contact with high compression for good heat transfer. Since the daughter heatsink is not required in this mounting, it eliminates one metal to metal thermal contact which would otherwise contribute to loss of thermal efficiency. The elimination of the additional daughter heatsink also maximizes ease of disassembly or reassembly for replacement of defective semiconductor packages as compared to present alternatives of semiconductor packages. Various other advantages will become apparent to those skilled in the art.

What is claimed is:

1. A power semiconductor device package, said package comprising:
    a semiconductor chip encapsulated in a body with two opposite major surfaces and two opposite end surfaces, a plurality of pins connected to the chip and extending from one end surface of the body;
    a relatively thick thermally conductive back having two opposite major surfaces and two opposite end surfaces, said body being mounted to one major surface of the back so that an end surface of the body is substantially flush with an end surface of the back; and
    each end surface of the back having at least one mounting hole therein for receiving external fasteners whereby the pins can be connected to a printed wiring board which is mounted adjacent one end surface of the back and wherein a heatsink can be directly connected to an opposite end surface of the back thereby eliminating the need for intermediate heatsinks and simplifying the replacement of the power semiconductor device package.

2. The semiconductor device package of claim 1 wherein the semiconductor device body is substantially rectangular having a given width, and wherein said backing is substantially rectangular having substantially the same width, yet longer and thicker than the semiconductor device body.

3. The semiconductor device package of claim 1 wherein at least one end surface of the back has a plurality of mounting holes therein.

4. The semiconductor device package of claim 1 wherein the body is metal and encapsulates a semiconductor chip electrically connected to the pin.

5. The semiconductor device package of claim 1 wherein the thermally conductive material is selected from the group of aluminum, copper, Kovar, molybdenum, beryllia and alumina.

6. The semicoductor device package of claim 1 wherein the mounting holes are aligned parallel to the axis of the pins.

7. The semiconductor device package of claim 1 which further comprises a second semiconductor chip encapsulated in a second body mounted to the other major surface of said back.

8. The mounting arrangement of claim 1 wherein said heatsink is attached to the end surface of the semiconductor device back by fastening devices extending through the corresponding holes in the heatsink and the back.

9. A power semiconductor device mounting arrangement comprising:
    a printed wiring board having a plurality of openings therein for receiving pins of a power semiconductor device pakage;
    a heatsink having a plurality of mounting openings therein;
    a power semiconductor device package having a body with two opposing major surfaces and two opposite end surfaces with pins extending from one end surface; said semiconductor device package further including a relatively thick metal back having a pair of opposing major surfaces and a pair of end surfaces, one major surface of the semiconductor body being mounted to a major surface of the back so that an end surface of the body is substantially flush with an end surface of the back, each end surface of the back having mounting holes therein;
    first fasteners extending through the openings in the printed wiring board into the mounting holes in one end surface of the back, said pins extending through the pin receiving openings in the printed wiring board for making electrical connection thereto, and second fasteners extending through the mounting openings in the heatsink into the mounting holes in the opposite end surface of the back; and
    whereby the back is in direct contact with the heatsink thereby eliminating intermediate heatsinks for cooling and wherein the arrangement is compact and permits easy replacement of the semiconductor package if necessary.

10. The mounting arrangement of claim 9 wherein the pins projecting from the semiconductor device body are soldered to the openings in the printed wiring board.

* * * * *